United States Patent
Gupta et al.

(10) Patent No.: US 9,082,494 B2
(45) Date of Patent: Jul. 14, 2015

(54) MEMORY CELLS HAVING A COMMON GATE TERMINAL

(75) Inventors: Rajesh N. Gupta, Alviso, CA (US); Farid Nemati, Redwood City, CA (US)

(73) Assignee: Micron Technology, Inc., Boise, ID (US)

( * ) Notice: Subject to any disclaimer, the term of this patent is extended or adjusted under 35 U.S.C. 154(b) by 436 days.

(21) Appl. No.: 13/350,061

(22) Filed: Jan. 13, 2012

(65) Prior Publication Data

US 2013/0182486 A1  Jul. 18, 2013

(51) Int. Cl.
G11C 11/00 (2006.01)
G11C 11/16 (2006.01)
H01L 45/00 (2006.01)
H01L 27/22 (2006.01)
H01L 27/24 (2006.01)

(52) U.S. Cl.
CPC ............ *G11C 11/161* (2013.01); *H01L 27/228* (2013.01); *H01L 27/2436* (2013.01); *H01L 27/2463* (2013.01); *H01L 45/04* (2013.01); *H01L 45/1233* (2013.01); *H01L 45/141* (2013.01); *H01L 45/146* (2013.01); *H01L 45/147* (2013.01); *H01L 45/16* (2013.01)

(58) Field of Classification Search
CPC .......... G11C 13/0002; G11C 13/0004; G11C 13/0007; G11C 13/0011; G11C 13/0069; G11C 2213/72; G11C 2213/79

USPC .................................. 365/100, 104, 148, 159
See application file for complete search history.

(56) References Cited

U.S. PATENT DOCUMENTS

| | | | |
|---|---|---|---|
| 5,986,327 A | 11/1999 | Mishio et al. | |
| 7,016,224 B2 | 3/2006 | King | |
| 7,426,128 B2 * | 9/2008 | Scheuerlein | 365/63 |
| 8,228,728 B1 * | 7/2012 | Yang et al. | 365/185.03 |
| 2005/0190564 A1 * | 9/2005 | Amano et al. | 362/336 |
| 2005/0190594 A1 * | 9/2005 | Nakamura et al. | 365/171 |
| 2006/0274566 A1 * | 12/2006 | Takashima et al. | 365/145 |
| 2007/0015348 A1 | 1/2007 | Hsu et al. | |
| 2008/0205121 A1 * | 8/2008 | Chen et al. | 365/158 |
| 2010/0118588 A1 * | 5/2010 | Chen et al. | 365/148 |
| 2010/0232200 A1 | 9/2010 | Shepard | |
| 2010/0246240 A1 | 9/2010 | Nakaya | |

* cited by examiner

*Primary Examiner* — Thao H Bui
(74) *Attorney, Agent, or Firm* — Brooks, Cameron & Huebsch, PLLC (57) ABSTRACT

Arrays of memory cells having a common gate terminal and methods of operating and forming the same are described herein. As an example, an array of memory cells may include a group of memory cells each having a resistive storage element coupled to a select device. Each select device includes a first terminal, a second terminal, and a gate terminal, where the gate terminal is common to each memory cell of the group.

12 Claims, 9 Drawing Sheets

MEMORY CELLS HAVING A COMMON GATE TERMINAL

TECHNICAL FIELD

The present disclosure relates generally to semiconductor memory apparatuses and methods, and more particularly to memory cells having a common gate terminal.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory, and flash memory, among others. Types of resistive memory include programmable conductor memory, and resistive random access memory (RRAM), among others.

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

RRAM devices include resistive memory cells that store data based on the resistance level of a storage element. The cells can be programmed to a desired state, e.g., corresponding to a particular resistance level, such as by applying sources of energy, such as positive or negative voltages to the cells for a particular duration. Some RRAM cells can be programmed to multiple states such that they can represent, e.g., store, two or more bits of data.

The programmed state of a resistive memory cell may be determined, e.g., read, for example, by sensing current through the selected resistive memory cell responsive to an applied interrogation voltage. The sensed current, which varies based on the resistance level of the memory cell, can indicate the programmed state of the resistive memory cell.

In various instances, arrays of resistive memory cells can include select devices, e.g., transistors and/or diodes, coupled to the resistive storage elements and used to select individual cells for operation. Providing access devices having suitably high current density capability, e.g., $1\times10^5$ A/cm$^2$ or higher, while having bidirectional I-V (current-voltage) profile characteristics exhibiting a high selection ratio, e.g., a ratio of current when a cell is selected to current when a cell is unselected, can be challenging.

DETAILED DESCRIPTION

Memory cells having a common gate terminal and methods of operating and forming the same are described herein. As an example, one or more arrays of memory cells can include a group of memory cells each including a resistive storage element coupled to a select device. Each of the select devices includes a first terminal, a second terminal, and a gate terminal, where the gate terminal of each select device is common to each memory cell of the group. The common gate terminal can be used to electrically dope a base semiconductor region located between the first terminal and the second terminal of the select device.

Embodiments of the present disclosure can provide benefits such as reducing variability that can occur in a semiconductor select device, thus making the select device difficult to control. For example, some select devices utilize chemical doping, i.e., introduction of chemical species, of a semiconductor material to obtain desirable characteristics. However, random dopant fluctuations can occur with chemical doping. These dopant fluctuations, particularly when semiconductor select devices are scaled, can lead to variability and therefore control difficulty. Some previous approaches have utilized a three terminal field effect transistor (FET) as a select device of a resistive memory cell, e.g., in a one transistor one resistor (1T1R) architecture. However, such previous approaches use the gate terminal of the FET as a control terminal used to turn the FET on/off. As such, the gates of adjacent select devices are separated, which can decrease memory density by increasing the memory cell area footprint. In contrast, one or more embodiments of the present disclosure provide a memory array using gated three terminal select devices, e.g., FETs, which share a common gate terminal. Providing a common gate between groups of memory cells can reduce the footprint of the array as compared to previous 1T1R architectures, among other benefits. For instance, the common gate terminal, as disclosed herein, can be used to electrically dope a base semiconductor region by creating an electric field that attracts charge carriers. In addition, the common gate terminal can provide electrostatic isolation between adjacent cells in the memory array.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 106 may reference element "6" in FIG. 1, and a similar element may be referenced as 206 in FIG. 2. Also, as used herein, "a number of" a particular element and/or feature can refer to one or more of such elements and/or features.

Figure 1:
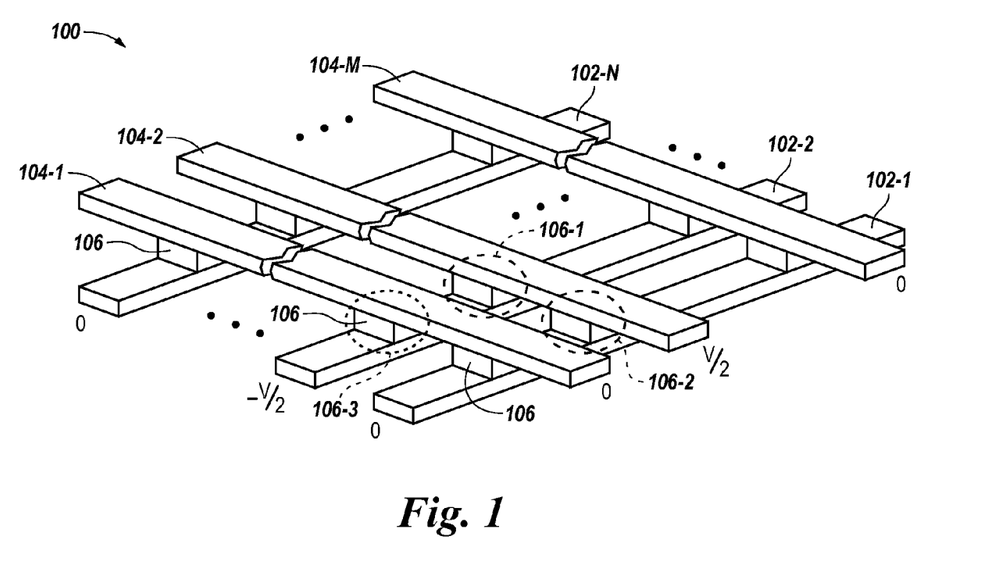
FIG. 1 is a block diagram of a portion of an array of memory cells in accordance with one or more embodiments of the present disclosure.

FIG. 1 is a block diagram of a portion of an array 100 of memory cells 106 in accordance with one or more embodiments of the present disclosure. The array 100 is a cross-point array having memory cells 106 located at the intersections of a number (N) of conductive lines, e.g., access lines, 102-1, 102-2, . . . , 102-N, which may be referred to herein as word lines, and a number (M) of conductive lines, e.g., data/sense lines, 104-1, 104-2, . . . , 104-M, which may be referred to herein as bit lines. As illustrated, the word lines 102-1, 102-2, . . . , 102-N are parallel to each other and are orthogonal to the bit lines 104-1, 104-2, . . . , 104-M, which are substantially parallel to each other; however, embodiments are not so limited. The word lines and/or bit lines can be a metal material such as, copper, titanium, and/or aluminum, for example.

Each memory cell 106 may include a resistive storage element coupled to a respective select device, e.g., access device, in accordance with one or more embodiments described herein. The resistive storage element can be coupled in series with the select device.

The resistive storage element may include a memory material formed between a pair of electrodes, for instance. The memory material can include a programmable portion having a variable resistance, for example. The memory material can include, for example, one or more variable resistance materials such as a transition metal oxide material or a perovskite including two or more metals, e.g., transition metals, alkaline earth metals, and/or rare earth metals. Other examples of variable resistance materials associated with the resistive storage element of a memory cell 106 can include chalcogenides, binary metal oxides, colossal magnetoresistive materials, and/or various polymer-based resistive variable materials, among others.

Figure 2:
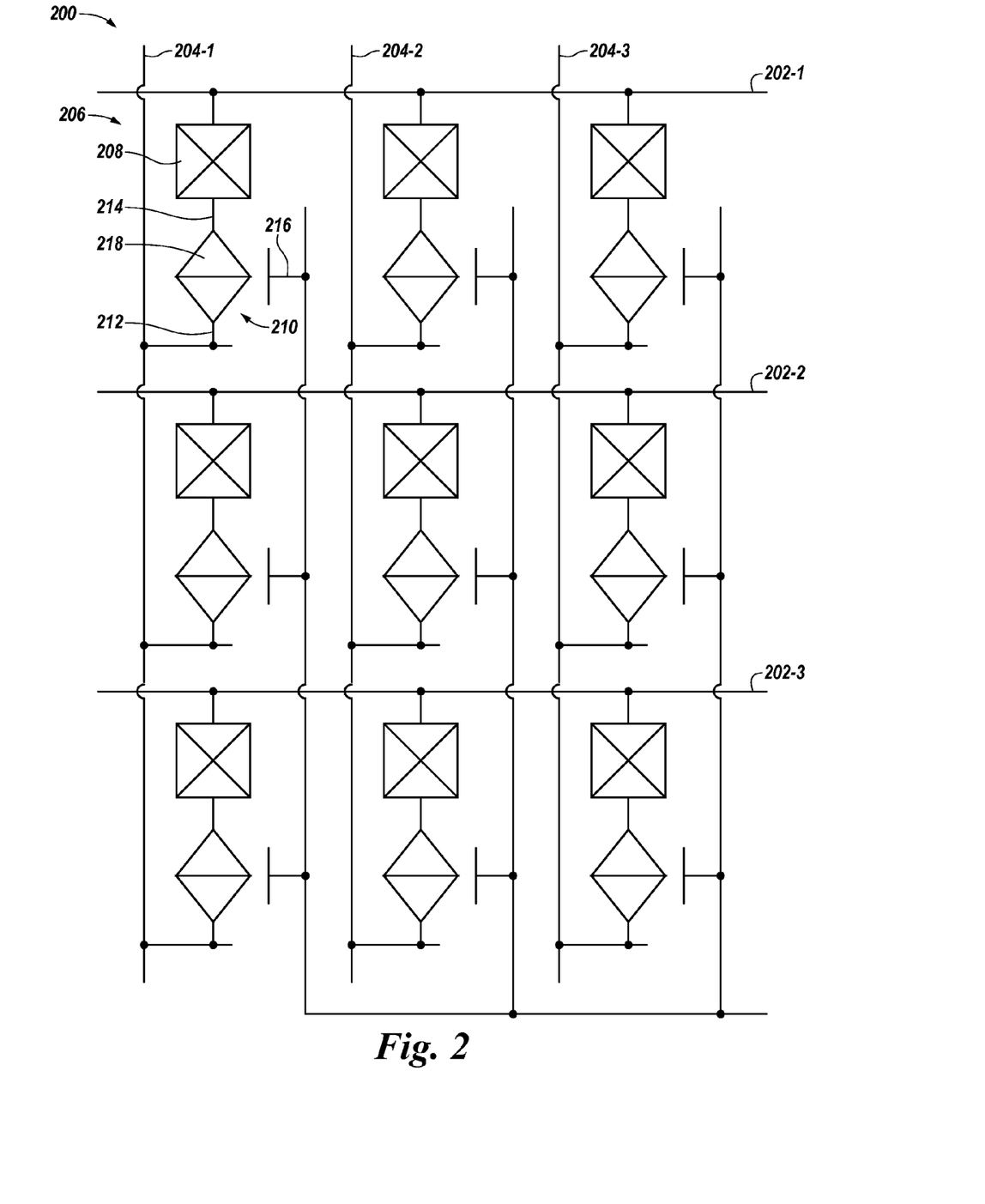
FIG. 2 is a schematic diagram of a portion of an array of memory cells in accordance with one or more embodiments of the present disclosure.

FIG. 2 is a schematic diagram of a portion of an array 200 of memory cells 206 in accordance with one or more embodiments of the present disclosure. Each of the memory cells 206 respectively includes a resistive storage element 208 coupled to a select device 210 at an intersection of a respective word line 202-1, 202-2, 202-3 and bit line 204-1, 204-2, 204-3. In this example, the select device 210 is a gated three terminal field effect transistor. The select device 210 can be bipolar/bidirectional, herein referring to conduction responsive to positive and negative applied voltages, and can exhibit a symmetric current-voltage (I-V) curve. However, embodiments are not so limited.

Each select device 210 includes a first terminal 212, which may be referred to herein as a source, and a second terminal 214, which may be referred to herein as a sink or a drain. Each select device 210 includes a gate terminal 216 that is common to each memory cell 206 of the array 200. For each of the memory cells 206 a base semiconductor material 218 is located between the first terminal 212 and the second terminal 214. Examples of the base semiconductor material 218 include, but are not limited to, silicon, germanium, silicon carbide, and combinations thereof. In one or more embodiments, the base semiconductor material 218 is undoped. In one or more embodiments, the based semiconductor material 218 is lightly doped.

Because the gate terminal 216 is common to each memory cell 206 of the array 200, a common gate voltage can be applied to each memory cell 206 of the array 200. Applying the common gate voltage to gates 216 creates an electric field that attracts charge carriers, e.g., holes, in a portion of the base semiconductor material 218 of each selector device 210 of the respective memory cells 206. The attraction results in an accumulation of charge carriers in that portion of the base semiconductor material 218. The accumulation of charge carriers corresponds to an electrical doping of the base semiconductor material 218, which can create a potential barrier to limit current flow through each of the select devices 210 responsive to sufficiently low voltages across the other two terminals 212, 214. For instance, a common gate voltage applied to gate terminal 216 can limit current through select device 210 responsive to a partial select voltage, e.g., a half select voltage, applied across the terminals 212, 214, e.g., in association with a program and/or read operation performed on cell 206.

Figure 3A:
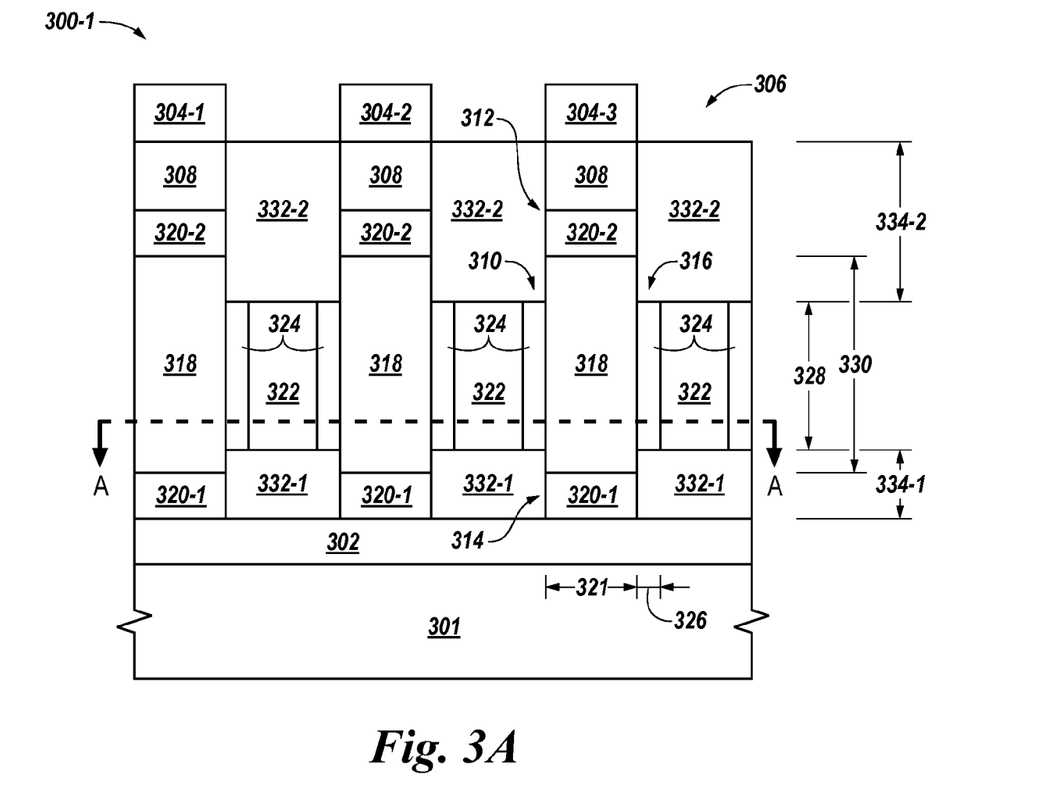
FIG. 3A is a cross-sectional diagram of a portion of an array of memory cells in accordance with one or more embodiments of the present disclosure.

FIG. 3A is a cross-sectional diagram of a portion of an array 300-1 of memory cells 306 in accordance with one or more embodiments of the present disclosure. The array 300-1 is formed on a substrate 301. The substrate 301 can be a silicon substrate, silicon on insulator (SOI) substrate, or silicon on sapphire (SOS) substrate, doped and undoped semiconductors, epitaxial layers of silicon supported by a base semiconductor foundation, and/or other semiconductor structures and technologies.

Forming the array 300-1 can include forming a conductive material 302, e.g., a metal, on the substrate 301. The conductive material 302 can serve as a word line for the array 300-1. As an example, a damascene process can be used to form the word lines by patterning and etching a dielectric material (not shown in FIG. 3A) formed on the substrate 301 and then forming conductive material 302 in the etched portions of the dielectric material. A chemical mechanical planarization (CMP), for example, can be used to planarize a surface, e.g., top surface, of conductive material 302.

A material stack including a first doped semiconductor material 320-1, a base semiconductor material 318, a second doped semiconductor material 320-2, and a resistive storage element 308 can be formed on the on the conductive material 302. The first and the second doped semiconductor materials 320-1, 320-2 can be heavily doped N-type, e.g., N+, or P-type, e.g., P+, silicon, germanium, silicon carbide, or polysilicon, for instance. The first and the second doped semiconductor materials 320-1, 320-2 can serve as respective terminals 314, 312 of the select devices 310. The base semiconductor material 318 can be an undoped or lightly doped silicon, germanium, silicon carbide, or polysilicon, for instance. Example dopants include, but are not limited to, boron, arsenic, phosphorus, gallium, and combinations thereof.

Although not shown in FIG. 3A, portions of the material stack are removed to form a common gate region, e.g., between adjacent cells 306. The common gate region can refer to a space between adjacent cells 306 created by removing portions of the material stack, e.g., via patterning and etching, down to the conductive material 302.

An isolation material 332-1 can be formed between adjacent cells 306, e.g., on conductive material 302. The isolation material 332-1 can be a dielectric material such as a silicon oxide or silicon nitride, for instance. Portions of the isolation material 332-1 may be removed, e.g., etched, to a desired height, which can depend upon particular desired dimensions of a common gate terminal associated with a cell 306, among other factors.

A gate dielectric material 324 can be formed, e.g., conformally, on a portion of the material stack, e.g., on a portion of the first and the second doped semiconductor materials 320-1, 320-2 and/or a portion of the base semiconductor material 318. The gate dielectric material 324 can be a dielectric material such as an oxide material or a nitride material, which serves to separate the base semiconductor material 318 of a select device 310 from a conductive gate material of the select device. Examples of oxides include, but are not limited to, aluminum oxide, tantalum oxide, magnesium oxide, and silicon oxide. Examples of nitrides include, but are not limited to, silicon nitride and aluminum nitride. The gate dielectric material 324 may have a dimension 326, e.g., a thickness, in a range of from about 20 angstroms to about 70 angstroms, for example.

A common gate conductive material 322 is formed in a portion of the common gate region, e.g., on a portion of the isolation material 332-1 and between portions of the gate dielectric material 324. The common gate conductive material 322 is formed such that the gate terminal 316 of each select device 310 is common to each of the cells 306 of the array 300-1. As such, a gate voltage applied to a gate terminal 316 is applied of the gate terminals of each of the cells 306 of the array 300-1. However, embodiments are not so limited. For example, gate dielectric material 324 may be omitted such that the common gate conductive material 322 is in direct contact with the base semiconductor material 318, e.g., such that a Schottky contact is formed.

Each gate terminal 316 may have a dimension 328, e.g., a height, in a range of from about 200 angstroms to about 800 angstroms, for example. In one or more embodiments, the dimension 328 may be less than a dimension 330 of the base semiconductor material 318. That is, the height 328 of the conductive gate material 322 may be such that it does not overlap the doped materials 320-1, 320-2, as shown in FIG. 3A. However, embodiments are not so limited. For instance, in one or more embodiments, the dimension 328 may be greater than the dimension 330. That is, the height 328 of the conductive gate material 322 may be such that it overlaps the doped materials 320-1, 320-2. Additionally, in one or more embodiments, the dimension 328 may equal to the dimension 330 of the base semiconductor material 318. A dimension 334-1 of the isolation material 332-1 and/or a dimension 334-2 of the isolation material 332-2 can be adjusted to achieve a desired gate height 328.

In this example, portions of the conductive gate material 322 and the gate dielectric material 324 can be removed, e.g., etched, to provide a desired gate dimension 328. A dielectric material 332-2 can be formed thereon and can serve as an isolation material between select devices 310.

Forming the array 300-1 can include forming a conductive material 304, e.g., a metal, on the resistive storage element 308. The conductive material 304 can serve as a bit line for the array 300-1. As an example, a damascene process can be used to form the bit lines 304-1, 304-2, 304-3 by patterning and etching a dielectric material (not shown in FIG. 3A) formed on the resistive storage element 308, the dielectric material 332-2, and/or the conductive gate material 322 and then forming conductive material 304 in the etched portions of the dielectric material. A CMP, for example, can be used to planarize a surface, e.g., top surface, of conductive material 304. The array 300-1 can formed using various processing techniques such as atomic material deposition (ALD), physical vapor deposition (PVD), chemical vapor deposition (CVD), supercritical fluid deposition (SFD), or other suitable processes.

Figure 3B:
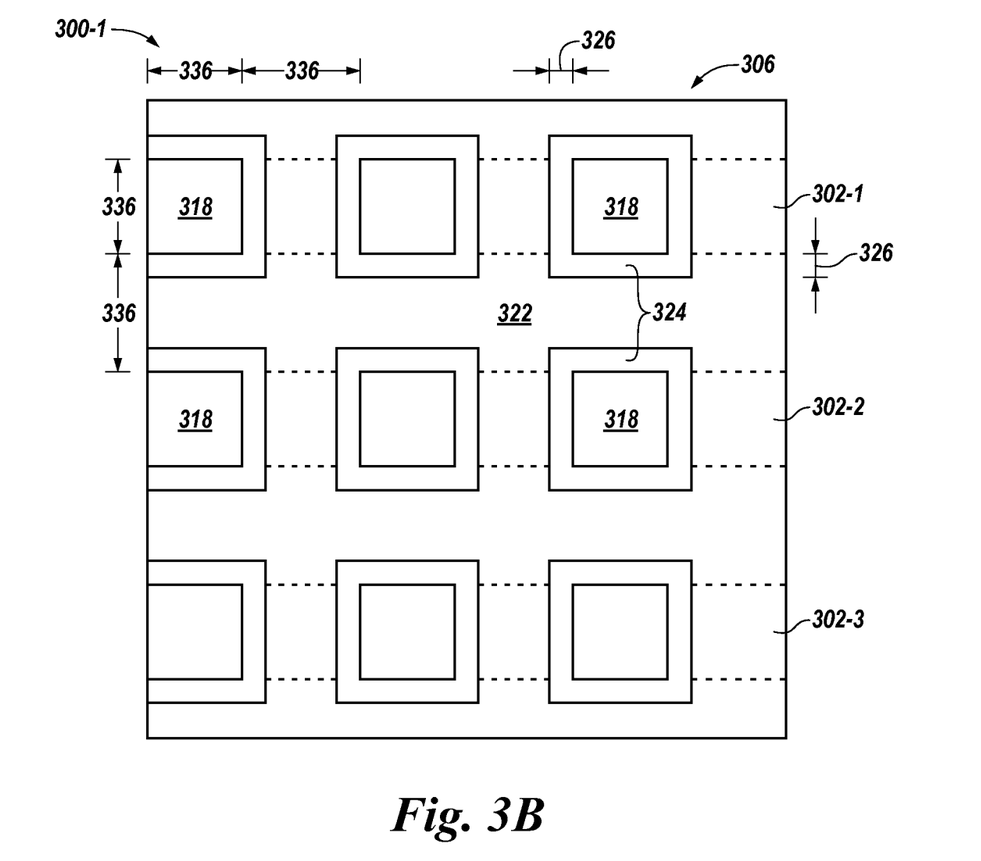
FIG. 3B is cross-sectional view taken along cut line A-A of FIG. 3A.

FIG. 3B is cross-sectional view taken along cut line A-A of FIG. 3A. As illustrated in FIG. 3B, the gate dielectric material 324 separates the gate conductive material 322 from the base semiconductor material 318. The gate conductive material 322 provides the gate terminal that is common to each memory cell 306 of the array 300-1. As such, the gate conductive material 322 surrounds each of the individual memory cells 306 of array 300-1.

FIG. 3B also illustrates that embodiments of the present disclosure can provide a $4F^2$ architecture. The feature width (F) 336 is illustrated such that a unit cell 306 has a $4F^2$ footprint.

In operation, the common gate voltage can be applied to the gate terminals 316 of cells 306, e.g., in order to electrically dope at least a portion of the base semiconductor material 318. A dimension 321, e.g., a width or a diameter, of material 318 can have a value less than or equal to about 30 nanometers, for instance. Embodiments are not limited to a particular dimension 321 and dimension 321 can be tailored to achieve desired electrical doping characteristics of base semiconductor material 318.

Figure 3C:
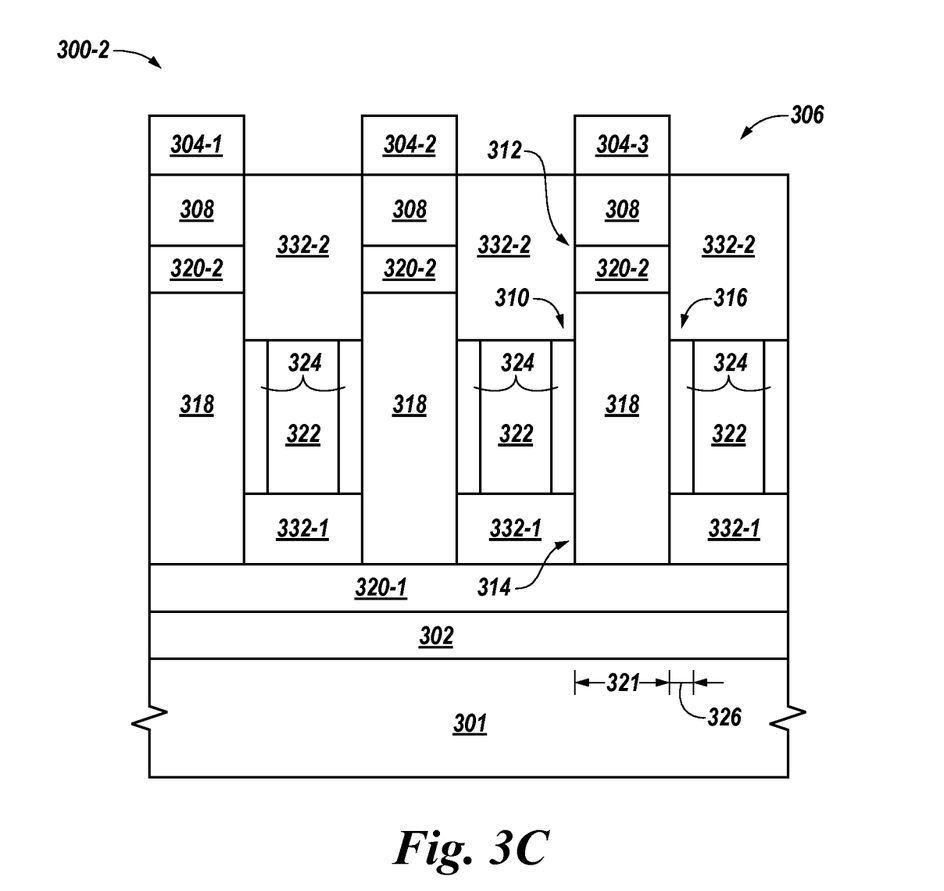
FIG. 3C is a cross-sectional diagram of a portion of an array of memory cells in accordance with one or more embodiments of the present disclosure.

In one or more embodiments, and as shown in FIG. 3C, forming the array 300-2 can include forming a conductive material 302, e.g., a metal, on a substrate 301. The conductive material 302 can serve as a word line for the array 300-2. As an example, a damascene process can be used to form the word lines by patterning and etching a dielectric material (not shown in FIG. 3C) formed on the substrate 301 and then forming conductive material 302 in the etched portions of the dielectric material. A CMP, for example, can be used to planarize a surface, e.g., top surface, of conductive material 302.

A material stack including a first doped semiconductor material 320-1, a first isolation material 332-1, a common gate conductive material 322, and a second isolation material 332-2 can be formed on the conductive material 302. The first semiconductor material 320-1 can be heavily doped N-type, e.g., N+, or P-type, e.g., P+, silicon, germanium, silicon carbide, or polysilicon, for instance. The first and second isolation materials 332-1, 332-2 can be a dielectric material such as a silicon oxide or silicon nitride, for instance.

Although not shown in FIG. 3C, portions of the material stack are removed to form pillars. Further processing can include forming additional materials, e.g., in spaces, between the pillars. The pillars can be formed, e.g., via patterning and etching, down to the first doped semiconductor 320-1, for example.

A gate dielectric material 324 can be formed, e.g., conformally, on a portion of first isolation material 332-1, a portion of the base semiconductor material 318, and/or a portion of the second isolation material 332-2. The gate dielectric material 324 can be a dielectric material such as an oxide material or a nitride material.

A base semiconductor material 318 can be formed on a portion of the first doped semiconductor 320-1, a portion of the second isolation material 332-2, and/or a portion of the gate dielectric material 324. The base semiconductor material 318 can be an undoped or lightly doped silicon, germanium, silicon carbide, or polysilicon, for instance. Example dopants include, but are not limited to, boron, arsenic, phosphorus, gallium, and combinations thereof. A CMP, for example, can be used to planarize a surface, e.g., top surface, of the base semiconductor material 318.

A second doped semiconductor material 320-2 can be formed on a portion of the base semiconductor material 318.

The second doped semiconductor material 320-2 can be the same as material 320-1. For example, the second doped semiconductor material 320-2 can be heavily doped N-type, e.g., N+, or P-type, e.g., P+, silicon, germanium, silicon carbide, or polysilicon, for instance.

A resistive storage element 308 can be formed on a portion of the second doped semiconductor material 320-2. The resistive storage element 308 can include a memory material between a pair of electrodes, for instance.

Forming the array 300-2 can include forming a conductive material 304, e.g., a metal, on the resistive storage element 308. The conductive material 304 can serve as bit lines for the array 300-2. As an example, a damascene process can be used to form the bit lines 304-1, 304-2, 304-3 by patterning and etching a dielectric material (not shown in FIG. 3C) formed on the resistive storage element 308 and/or the dielectric material 332-2 and then forming conductive material 304 in the etched portions of the dielectric material. The array 300-2 can formed using various processing techniques such as atomic material deposition (ALD), physical vapor deposition (PVD), chemical vapor deposition (CVD), supercritical fluid deposition (SFD), or other suitable processes.

In accordance with one or more embodiments of the present disclosure, the array 300-2 may be formed without including the first doped semiconductor material 320-1 and the second doped semiconductor material 320-2. For instance, the base semiconductor material 318 can be formed on metal material 302 and the resistive storage element 308 can be formed on the base semiconductor material 318 such that metal-semiconductor contacts, e.g., Schottky contacts, are formed.

As an example, one or more arrays described herein can be operated in accordance with a half select method. A half select method can include applying a half select voltage (V/2) to a selected bit line, e.g., a bit line coupled to a selected memory cell, and a negative half select voltage (−V/2) to a selected word line, e.g., a word line coupled to the selected memory cell, while a common gate voltage is applied to each memory cell of the array.

Referring to FIG. 1, the array 100 can be operated in accordance with a half select method. In FIG. 1, memory cell 106-1 represents a selected memory cell. That is, memory cell 106-1 is coupled to a selected bit line 104-1 having a voltage of V/2 applied thereto and to a selected word line 102-1 having a voltage of −V/2 applied thereto. As such, a full select voltage (V) is applied across the selected memory cell 106-1. The unselected memory cells coupled to the selected bit line 104-1 and selected word line 102-1, e.g., unselected memory cells 106-2 and 106-3, experience a half select voltage of +/−V/2 and can be referred to as "half selected" memory cells. Since each of the memory cells 106 share a common gate, a common gate voltage can be applied to each memory cell, including the selected memory cell 106-1, the half selected memory cells, and the unselected memory cells coupled to unselected bit lines and/or word lines. The select voltage (V) can be a write voltage or a read voltage, for instance. In the example illustrated in FIG. 1, the unselected word lines and bit lines are grounded, e.g., 0 V is applied.

It can be beneficial to provide a half select ratio (HSR), which may also be referred to as an on current versus off current ratio (Ion/Ioff), that is as large as possible. The HSR can refer to a ratio of the current flowing through a memory cell having full select voltage (V) applied across that memory cell, e.g., across the select device and resistive storage element, to the current flowing through a memory cell having one half of the full select voltage, e.g., V/2 or −V/2, applied to that same memory cell, e.g., across the select device and resistive storage element. Select devices having a common gate terminal such as disclosed herein, can provide a half select ratio of $10^2$:1, $10^3$:1 or larger, such as $10^7$:1 for example. The larger the HSR, the lower the power dissipation caused by current flow in half-selected memory cells, e.g., 106-2 and 106-3, and the greater the signal to noise ratio (S/N) during read and/or write operations, which can reduce the likelihood of read and/or write disturb to half selected memory cells. The half select method is provided as one example and embodiments are not limited to a particular programming and/or read method.

Figure 4A:
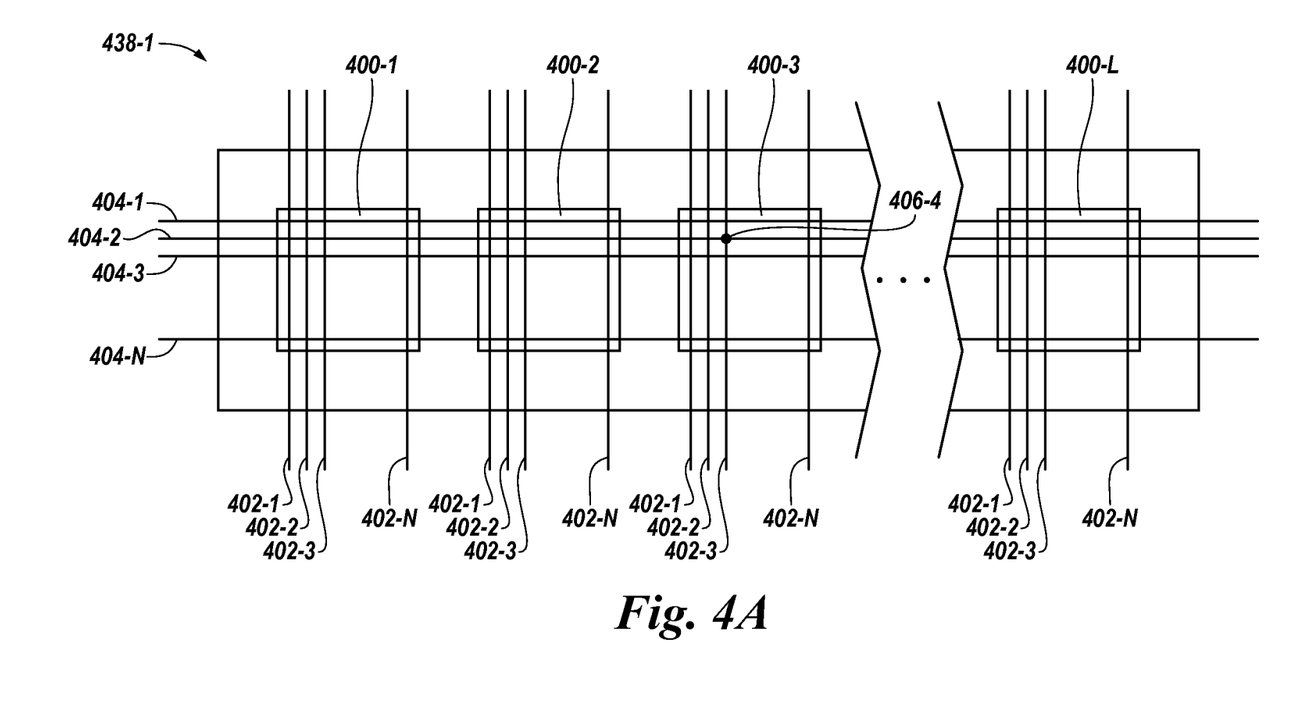
FIG. 4A is a block diagram of a portion of a memory device in accordance with one or more embodiments of the present disclosure.

FIG. 4A is a block diagram of a portion of a memory device 438-1 in accordance with one or more embodiments of the present disclosure. The memory device can be an RRAM device, for example, and can include one or more arrays as described herein. The memory device 438, which may be referred to as a tile, includes a number (L) of groups 400-1, 400-2, 400-3 . . . 400-L of memory cells. Each group 400-1 to 400-L shares a common gate. For example, the cells of group 400-1 can share a common gate and the cells of 400-L can share a common gate, e.g., each of the groups 400-1 to 400-L can have separate common gates. Each group 400-1 to 400-L can be an entire array or a portion of an array of memory cells as disclosed herein.

In FIG. 4A, the groups 400-1, 400-2, 400-3 . . . 400-L share common bit lines 404-1, 404-2, 404-3 . . . 404-M and can share common bit line drivers and sense circuitry (not shown). However, embodiments are not so limited. For instance, the groups 400-1, 400-2, 400-3 . . . 400-L may share common word lines 402-1, 402-2, 402-3 . . . 402-N.

The numbers L, M, and N can have various values. For instance, L can be 8, 16, 32, or 64, and M and N can be 64, 128, or 256, for instance. However, L, M, and N are not limited to these values and may have other values for some applications.

As an example, a number (K) of memory devices 438 may be stacked together, e.g., three dimensionally, to form K layers, where the bit lines 404-1, 404-2, 404-3 . . . 404-M are common between the K layers. As an example, K has a value up to and including 16. However, K is not limited to these values and may have other values for some applications.

As discussed, the gate terminal of the select devices of each memory cell in a particular group, e.g., 400-1 to 400-L, is common. As such, a common gate voltage can be applied to the memory cells of each particular group. In one or more embodiments, a same common gate voltage can be applied to each of the groups 400-1, 400-2, 400-3 . . . 400-L. For one or more embodiments, the common gate voltage applied to each of the arrays 400-1, 400-2, 400-3 . . . 400-L may be the same common gate voltage. However, in one or more embodiments, differing common gate voltages may be applied to one or more of the respective groups 400-1, 400-2, 400-3 . . . 400-L. For example, a particular memory cell 406-4 of the group 400-3 may be selected, e.g., by having a voltage V/2 applied via bit line 404-2 and voltage −V/2 applied via word line 402-3. While the particular memory cell 406-4 is selected, a particular common gate voltage can be applied to the group 400-3, while different common gate voltages can be applied to the other groups of memory device 438-1.

Figure 4B:
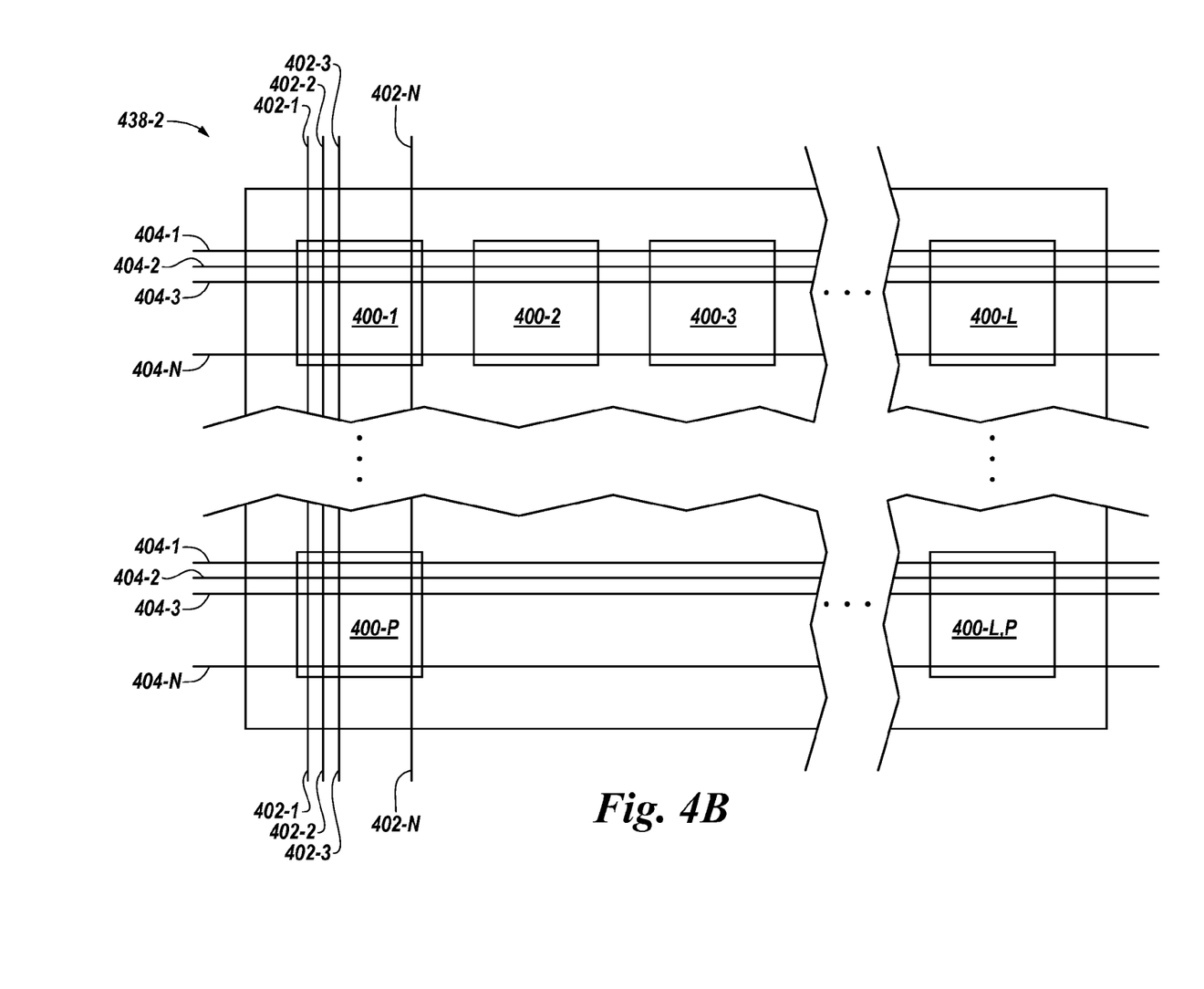
FIG. 4B is a block diagram of a portion of a memory device in accordance with one or more embodiments of the present disclosure.

FIG. 4B is a block diagram of a portion of a memory device 438-2 in accordance with one or more embodiments of the present disclosure. Memory device 438-2 is similar to memory device 438-1. However, memory device 439-2 includes multiple sets of groups of cells that share common bit lines 4004-1 to 404-M and common word lines 402-1 to 402-N. For instance, device 438-2 is an L×P device with L corresponding to a number of groups sharing a set of common bit lines and P corresponding to a number of groups sharing different common bit lines. As an example, P may be 16, 32, or 64.

Figure 5A:
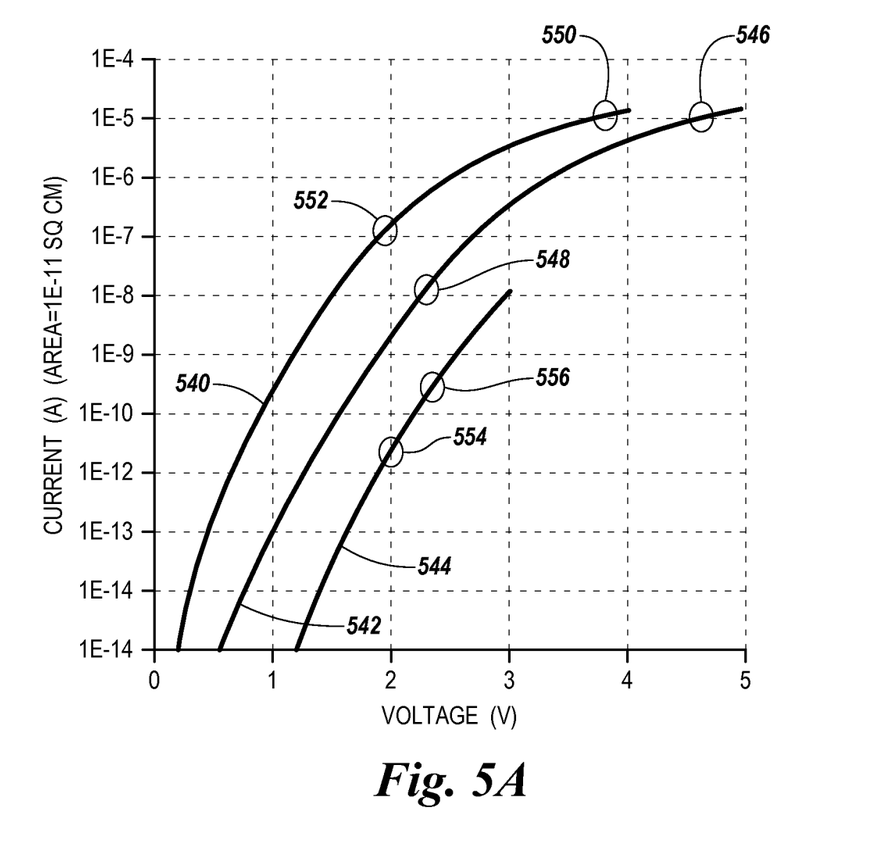
FIG. 5A illustrates a current versus voltage diagram associated with an array of memory cells having a common gate in accordance with one or more embodiments of the present disclosure.

FIG. 5A illustrates a current versus voltage diagram, which may be referred to as an I (current)–V (voltage) curve, associated with an array of memory cells having a common gate in accordance with one or more embodiments of the present disclosure. The particular types of materials and/or dimensions, e.g., thicknesses, lengths, heights, and such, of those materials that are incorporated into memory cells, as disclosed herein, can be tailored to achieve desirable I-V curve characteristics associated with RRAM operations, for instance.

As an example, an array of memory cells including one or more select devices as described herein can achieve a HSR of $1 \times 10^5$ or greater. Various select devices as described herein can support a current density of $1 \times 10^6$ A/cm$^2$ or greater.

The current versus voltage diagram illustrated in FIG. 5A includes I-V curve 540, I-V curve 542, and I-V curve 544. Each of these I-V curves illustrates data associated with a select device, in accordance with one or more embodiments of the present disclosure. FIG. 5A corresponds to a select device having a gate terminal dimension, e.g., height, of 600 angstroms and a gate dielectric material dimension, e.g., thickness, of 50 angstroms. Curve 540 corresponds to an applied common gate voltage of −1.5 V, I-V curve 542 corresponds to a common gate voltage of −2.0 V, and curve 544 corresponds to an applied common gate voltage of −3.0 V.

Location 546 on curve 542 corresponds to an on current (Ion), which occurs at approximately 4.6 V. Location 548 on curve 542 corresponds to an off current (Ioff), which occurs approximately 2.3 V. As such, the Ion/Ioff current ratio is approximately $1 \times 10^3$.

Location 550 on curve 540 corresponds to an on current (Ion), which occurs at approximately 3.8 V. Location 552 on curve 540 corresponds to an off current (Ioff), which occurs at approximately 1.9 V. As such, the Ion/Ioff current ratio is approximately $1 \times 10^2$.

Additionally, FIG. 5A illustrates that select devices associated with I-V curve 540 and I-V curve 542 support a high current density. The current density for both curve 540 and curve 542 is approximately $1 \times 10^6$ A/cm$^2$ in this example.

As discussed above in connection with FIGS. 4A and 4B, a first common gate voltage can be applied to a first group of memory cells of a memory device while a second, e.g., different, common gate voltage can be applied to a second group of memory cells of the memory device. Providing different common gate voltages to different groups of memory cells can provide benefits such as increasing a half select ratio associated with the groups, for instance.

For example, a first common gate voltage, e.g., −1.5 V can be applied to a first group of memory cells, e.g., 400-1 shown in FIG. 4A, to produce I-V curve 540 and a second common gate voltage, e.g., −3.0 V, can be applied to a second group of memory cells, e.g., 400-2 shown in FIG. 4A, to produce I-V curve 544. As discussed, location 550 on I-V curve 540 corresponds to an on current (Ion) at a voltage of approximately 3.8 V. One half of this voltage, i.e., approximately 1.9 V, corresponds to an off current (Ioff) at location 554 on I-V curve 544. The current at location 550 on curve 540 is approximately $1 \times 10^6$ greater than the current at location 554 on curve 544.

Similarly, a first common gate voltage, e.g., −2.0 V can be applied to a first group of memory cells, e.g., 400-1 shown in FIG. 4A, to produce I-V curve 542 and a second common gate voltage, e.g., −3.0 V, can be applied to a second group of memory cells, e.g., 400-2 shown in FIG. 4A, to produce I-V curve 544. As discussed, location 546 on curve 542 is at a current 546 corresponds to an on current (Ion) at a voltage of approximately 4.6 V. One half of this voltage, i.e., approximately 2.3 V, corresponds to an off current (Ioff) at location 556 on curve 544. The current at location 546 on curve 542 is approximately $1 \times 10^5$ greater than the current at location 556 on curve 544.

In one or more embodiments of the present disclosure, a select device associated with an array memory cells may be configured for impact ionization operation. For these embodiments, the common gate voltage can be used to prevent current flow unless impact ionization occurs. For these embodiments, an array of memory cells can be tailored such that a current associated with a memory cell experiencing an applied select voltage corresponding to a half select method, such as described herein, can be at least about $1 \times 10^7$ times greater than a current through a memory cell having a half select voltage applied across it.

Figure 5B:
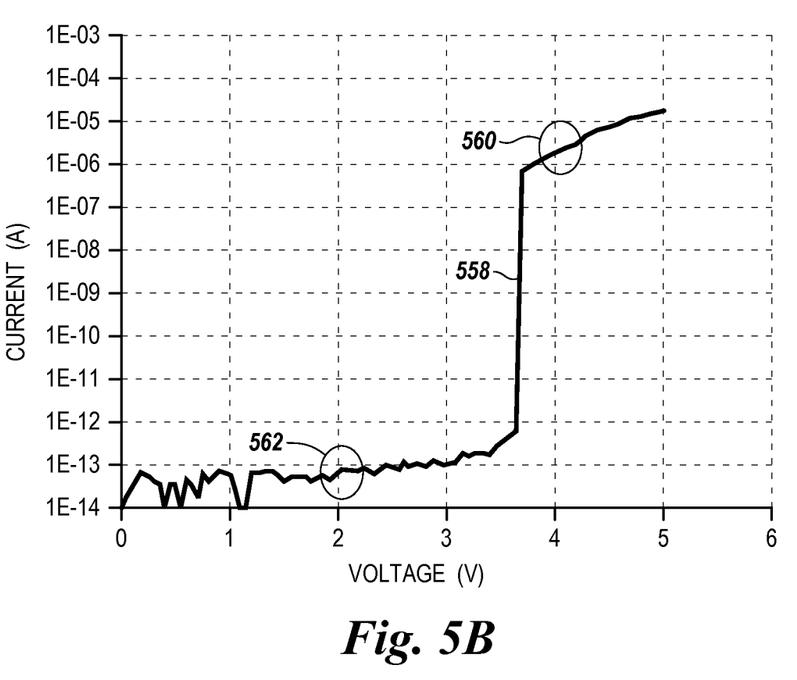
FIG. 5B illustrates a current versus voltage diagram associated with an array of memory cells having a common gate in accordance with one or more embodiments of the present disclosure.

FIG. 5B illustrates a current versus voltage diagram associated with an array of memory cells having a common gate in accordance with one or more embodiments of the present disclosure. The diagram shown in FIG. 5B corresponds to memory cells having a select device configured for impact ionization operation. I-V curve 558 represents data obtained for a select device having a gate terminal dimension, e.g., height, of 600 angstroms and a gate dielectric material dimension, e.g., thickness, of 50 angstroms. Curve 558 represents data corresponding to an applied common gate voltage of −1.0 V.

An on current (Ion) for curve 558 occurs at location 560, which corresponds to approximately 4.0 V. One half of this voltage, i.e., approximately 2.0 V, corresponds to an off current (Ioff) of curve 558 at location 562. The current at location 558 is approximately $1 \times 10^8$ greater than the current at location 562. The data of FIG. 5B illustrates that employing impact ionization operation can provide an increased HSR in one or more embodiments.

As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present invention and are not to be used in a limiting sense.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An array of memory cells, comprising:
    a group of memory cells, each including a resistive storage element coupled to a select device, wherein the group includes at least three memory cells such that at least two of the three memory cells are physically connected to a first sense line and at least two of the three memory cells are physically connected to a first access line;
    wherein each select device includes a base semiconductor material, a first terminal, a second terminal, and a gate terminal; and
    wherein the gate terminal of each select device is formed from a continuous gate terminal material that surrounds each of the base semiconductor materials, and wherein the gate terminal of each select device is common to each memory cell of the group.

2. The array of memory cells of claim 1, wherein the group includes at least two hundred fifty six memory cells physically connected to the first sense line and at least two hundred fifty six memory cells physically connected to the first access line.

3. The array of memory cells of claim 1, wherein each cell of the group of memory cells has an area that is $4F^2$.

4. The array of memory cells of claim 1, wherein the gate terminal of each select device has a gate electrode material that is separated from the base semiconductor material by a dielectric material having a thickness in a range of about 20 angstroms to about 70 angstroms.

5. The array of memory cells of claim 4, wherein the gate terminal has a height in a range of about 200 angstroms to about 800 angstroms.

6. The array of memory cells of claim 1, wherein each select device is bipolar.

7. The array of memory cells of claim 1, wherein each select device includes the base semiconductor material having a width less than or equal to 30 nanometers.

8. A method of operating an array of memory cells, comprising:
    applying a common gate voltage to a first group of memory cells that each includes a resistive storage element coupled to a select device having a first terminal, a second terminal, and a gate terminal that is common to each memory cell of the group, wherein the first group includes at least three memory cells such that at least two of the three memory cells are physically connected to a first sense line and at least two of the three memory cells are physically connected to a first access line;
    applying a first voltage to a conductive line coupled to the first terminal of the select device of a memory cell; and
    applying a second voltage to a conductive line coupled to the second terminal of the select device of the memory cell to select the memory cell.

9. The method of claim 8, wherein applying the common gate voltage creates a potential barrier to current flow through each of the select devices.

10. The method of claim 8, further including:
    applying a second common gate voltage to a second group of memory cells coupled to the first group of memory cells, wherein the each of the second group of memory cells includes a resistive storage element coupled to a select device having a first terminal, a second terminal, and a second common gate terminal.

11. The method of claim 10, wherein the common gate voltage is equal to the second common gate voltage.

12. The method of claim 10, wherein the common gate voltage is different than the second common gate voltage.

* * * * *